United States Patent [19]
Rieger et al.

[11] Patent Number: 5,317,217
[45] Date of Patent: May 31, 1994

[54] UNIVERSAL ACTIVE FILTER

[75] Inventors: Martin Rieger, Rottweil; Sabine Roth, Villingen-Schwenningen, both of Fed. Rep. of Germany

[73] Assignee: Deutsche Thomson-Brandt GmbH, Villingen-Schwenningen, Fed. Rep. of Germany

[21] Appl. No.: 67,832

[22] Filed: May 27, 1993

[30] Foreign Application Priority Data

Nov. 29, 1990 [DE] Fed. Rep. of Germany ....... 4038111

[51] Int. Cl.$^5$ .......................... H03B 1/00; H03K 5/00
[52] U.S. Cl. ..................... 307/521; 328/167
[58] Field of Search ............... 307/520, 521; 328/167; 330/107, 109, 303, 306

[56] References Cited

U.S. PATENT DOCUMENTS

| | | | |
|---|---|---|---|
| 4,851,718 | 7/1989 | Hagino et al. | 328/167 |
| 4,857,778 | 8/1989 | Hague | 328/167 |
| 5,182,478 | 1/1993 | Nomura | 307/521 |
| 5,192,884 | 3/1993 | Kusano | 328/167 |

FOREIGN PATENT DOCUMENTS 3830410  3/1989 Fed. Rep. of Germany .

OTHER PUBLICATIONS

IEEE Transactions on Circuits and Systems, vol. 35, No. 8, Aug. 1988, New York, pp. 936-945, Sanchez-Sinencio et al., "Generation of Continuous-Time Two Integrator Loop OTA Filter Structures".

*Primary Examiner*—Timothy P. Callahan
*Attorney, Agent, or Firm*—Joseph S. Tripoli; Peter M. Emanuel; Richard G. Coalter

[57] ABSTRACT

A universal filter is provided with three inputs Vh, Vb and Vl, with one output Vout, with two transconductance amplifiers Gm1, Gm2, with four capacitors mCO, (1-m)CO, CO and LCO and an amplifier K as well as a voltage follower VF. Depending on the connections of the three inputs, the universal filter takes the form of a high-pass or low-pass or band-pass filter or a trap filter or an all-pass or an otherwise active filter. Advantageously, by selection of parameters (e.g., trans-conductance, gain, scaling), the various filter characteristics like quality (Q), slope, median frequency, amplification, etc., may be adjusted. A further advantage is that the low component count of the filter provides improved reliability, reduced cost and facilitates efficient and economic fabrication in discrete or integrated circuit form.

16 Claims, 5 Drawing Sheets

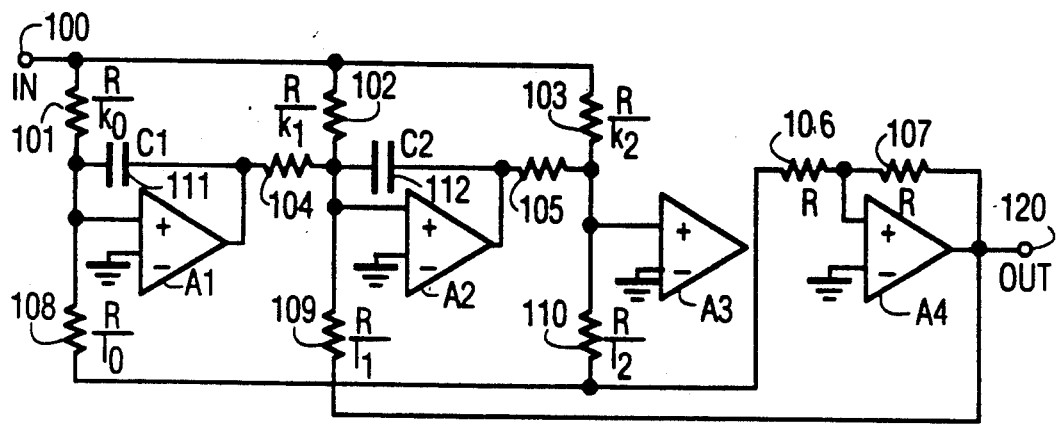
FIG.1a
PRIOR ART
$$A(P) = \frac{k_0 - k_1\omega_0\tau P + k_2\omega_0^2\tau^2 P^2}{l_0 + l_1\omega_0\tau P + l_2\omega_0^2\tau^2 P^2}$$
FIG.1b
PRIOR ART
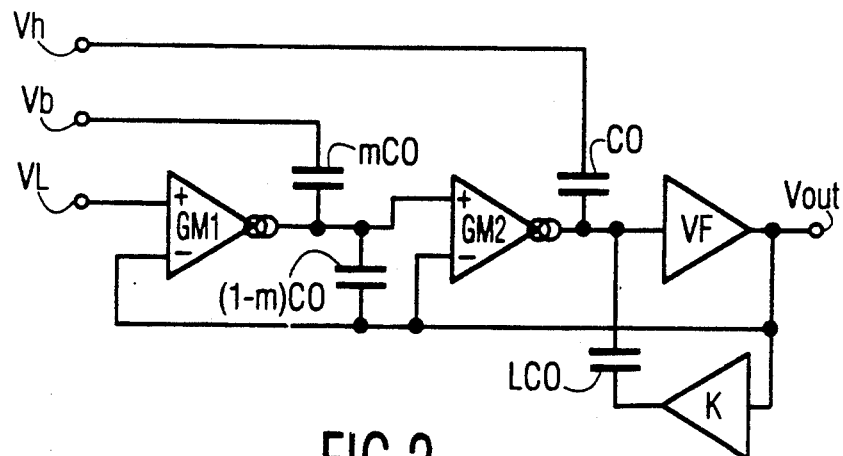
FIG.2

UNIVERSAL ACTIVE FILTER

Cross-Reference to Related Applications

This application is a continuation of PCT/EP No. 91/02196 filed Nov. 21, 1991 according to P 40 38 111.0 of Nov. 29, 1990.

1. Field of the Invention

This invention relates to electrical filters and particularly to universal active electronic filters with independently adjustable parameters.

2. Background of the Invention

It is known, with all types of filters, in particular with active filters such as low pass, high pass, band pass, band elimination (trap filters), all pass etc., to specify circuits as simple as possible. However, sometimes there appears the requirement of realizing, by means of a single circuit, all above named types of filters as well as more general filter functions according to the transfer function of a second order filter block of the general form.

$$A(P) = \frac{d_0 + d_1 P + d_2 P^2}{c_0 + c_1 P + c_2 P^2} \qquad \text{G1.1.1}$$

wherein the filter coefficients $d_0$, $d_1$, $d_2$, $c_0$, $c_1$ and $c_2$ may be arbitrary or randomly selected for a specific application. Such filters are called universal filters and are active filters.

A circuit embodiment for universal filters is known from "Halbleiterschaltungstechnik" (Semiconductor circuit technology), ninth revised and extended edition, U. Tietze, Ch. Schenk, Springerverlag 1989, page 444, illustration 14.42. With such a circuit individual coefficients can be adjusted independently of each other because each coefficient depends only on one circuitry component.

Moreover, the above named source indicates filters with adjustable parameters in the circuit in which the resonance frequency, the quality ("Q") and the amplification with the resonance frequency can be adjusted independently of each other.

The advantage of such a universal filter is in particular that it operates at the same time, depending on which output is used, as a selective filter, elimination filter or trap, as a low pass and/or high pass or as a high pass. Depending on the dimensioning of individual circuitry components one respective filter type can be determined and the filter characteristics changed. Furthermore, with the given type of filter the limit frequency and the amplification can be tuned (varied) independently of each other.

Even during operation in band pass or band elimination modes, the resonance frequency, the amplification, and the quality (Q) can be modified without having any influence on each other.

Universal filters are available in the form of integrated circuits with which one only needs to connect a few resistors outside in order to determine the type of filter and the limit frequency.

The circuits known from the above mentioned source, however, have the disadvantage that they are made from a relatively large number of circuitry components which makes integration in a semiconductor circuit difficult and, therewith, expensive.

SUMMARY OF THE INVENTION

It is therefore an object of the invention to form a universal filter which exhibits a simple and low-expenditure circuit design.

A universal active filter in accordance with the invention includes first, second and third inputs and an output. The first input is connected with the non-inverting input of a first trans-conductance amplifier. The second input is connected, via a first capacitor, with the output of the first trans-conductance amplifier, with the non-inverting input of a second trans-conductance amplifier, as well as with a second capacitor. The third input is connected, via a third capacitor, with the output of the second trans-conductance amplifier, with the input of a voltage follower, and with a feedback capacitor. The filter output is connected to the output of the voltage follower, to the inverting inputs of the two trans-conductance amplifiers, to the second capacitor, as well as to the input of an amplifier the output of which is connected to the feedback capacitor.

Advantageously, depending on the configuration of the inputs, the universal filter of the present invention may be configured as high pass filter or a low pass filter or a band pass filter or a band elimination (trap filter) or as an all pass filter or as another active filter.

Additionally, depending on the dimensioning of parameters (such as transconductance values and design constants), different filter characteristics like quality (Q), edge steepness, center frequency, amplification, etc. can be adjusted.

A further advantage is that filter reliability is improved in the present invention due to the reduction in required circuit components. For example, an active universal filter according to Tietze-Schenk, page 444 (FIG. 1) 10 resistors, 2 capacitances and 4 operational amplifiers are required. However, with the circuit according to the invention only 2 conductance amplifiers, 4 capacitances, 1 voltage follower, and 1 voltage amplifier. Therefore, the expenditure for circuitry is markedly reduced and reliability is increased.

In particular, by means of the universal filter structure according to the invention a band pass filter or an elimination filter can be constructed in an extraordinary manner, and these can be tuned as desired with respect to center frequency, quality, edge steepness and amplification etc.

BRIEF DESCRIPTION OF THE DRAWING

The foregoing and further features of the invention are illustrated in the accompanying drawing, wherein like elements are denoted by like reference designators, and in which:

FIG. 1a is a block diagram of a second order universal filter with independently adjustable coefficients (known);

FIG. 1b is an expression illustrating the transfer function of the filter of FIG. 1a;

FIG. 2 is a block diagram of a universal filter according to the invention;

FIGS. 4b and 4c are diagrams illustrating the frequency response characteristics of the band pass filter according to FIG. 4a;

DETAILED DESCRIPTION

FIG. 1a shows a second order universal filter with independently adjustable coefficients an having an associated transfer function A(P) as illustrated in FIG. 1b. Such filters are known, for example, from the book "Halbleiter-Schaltungstechnik" (Semiconductor circuit technology), ninth revised and extended edition, U. Tietze, Ch. Schenk, Springerverlag 1989, pages 444 through 447. This universal filter has a relatively complicated and high-expenditure design. After all, four operational amplifiers ($A_1$, $A_2$, $A_3$, $A_4$), ten resistors (101–110) and two capacitances (C1, C2) are required to realize this universal filter. Such a filter can be adjusted for a certain type of filter depending on the variation of the coefficients $k_0$, $k_1$, $k_2$, $L_0$, $L_1$, and $L_2$. In particular, the filter types named are low pass, high pass, band pass, all pass filters, and band elimination.

Figure 8:
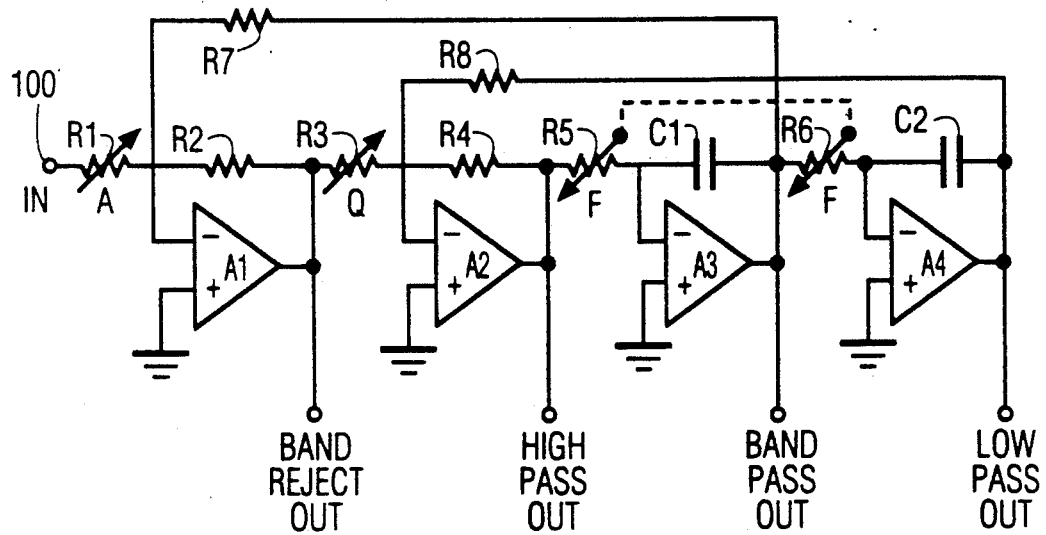
FIG. 8 is a block diagram of a universal filter with independently adjustable parameters (known).

For the adjusting of different filter types and the simultaneous varying of the filter parameters or characteristics, FIG. 8 herein illustrates another example of a known second order universal filter with independently adjustable parameters (see the book "Halbleiter-Schaltungstechnik", p. 446). This filter is provided with 4 operational amplifiers (A1–A4), four fixed and four adjustable resistors (R1–R8), and two capacitances (C1, C2) as well as four outputs (four pins with one chip) and one input. Each output represents a branch-off for a certain filter type. Even with this universal filter the expenditure on circuitry and, therewith, the overhead for an integratable circuit is relatively high.

FIG. 2 shows the basic structure of a universal filter according to the invention. The universal filter is provided with two conductance amplifiers GM1 and GM2, as well as four capacitances (capacitors) mCO, (1-m)CO, CO and LCO, as well as an amplifier K and a unity gain voltage follower VF, as well as three inputs Vh, Vb and VL as well as one output Vout. The voltage follower VF has a high-resistance input and is practically formed as an impedance transformer with the amplification of times 1 (i.e., unity gain).

The input VL is connected to the non-inverting input of the first trans-conductance amplifier GM1 with the amplification gm1. The input Vb is connected, via the first capacitance mCO, with the output of the first trans-conductance amplifier GM1, with the non-inverting input of the second transconductance amplifier GM2 with the amplification gm2, as well as with the second capacitor (1-m)CO. The input Vh is connected, via the third capacitor CO, with the output of the second transconductance amplifier GM2, with the input of the voltage follower VF with high-resistance input, and with a feedback capacitor LCO. The output Vout is connected to the output of the voltage follower VF, to the inverting inputs of the two trans-conductance amplifiers GM1 and GM2, to the capacitor (1-m)CO, as well as to the input of an amplifier K having an amplification or gain of k. The output of the amplifier K is connected with the feedback capacitance LCO. All connections are designed to be electrically conductive.

In this form, in accordance with the second order general formula G1.1.1 the resultant circuit response for the output voltage (Vout) for the filter of FIG. 2, as a function of the various circuit parameters, may be expressed as follows:

$$Vout = \frac{VL + m^*(p/p0) + Vb + (p^2/p0^2)^*(gm1/gm2)^*Vh}{1 + m^*(p/p0) + (p/p0)^*(gm1/gm2)^*[(1 + L) - (L^*k)]} \quad G1.2.1$$

In this equation Vout is the output voltage, gm1 and gm1 are the transconductances of the operational transconductance amplifiers, pO is the design center or band edge frequency, p is the frequency variable and the factors m, L and k are design variables. Depending on the input configuration of the three inputs VL, Vb and Vh the universal filter is designed either as high pass filter or low pass filter or band pass filter or all pass filter or band elimination (trap) or as another active filter. Depending on the dimensioning of the parameters (gm1, gm2, m, L, and k), the different filter characteristics like quality, amplification, center frequency, edge steepness etc. can be adjusted.

Figure 3A:
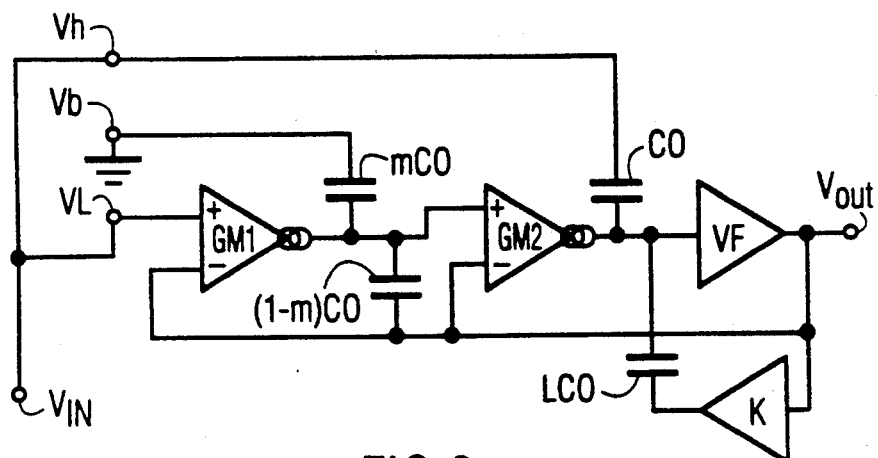
FIG. 3a is a block diagram of the universal filter according to FIG. 2 wired as a band elimination filter or trap.

FIG. 3a shows the universal filter according to FIG. 2 wired as trap filter or band elimination filter. The inputs VL and Vh are connected to each other. These two inputs form the common input of the circuit for receiving an input signal Vin to be filtered. The input terminal Vb is clamped to ground. Hereby, the following results for Vout:

$$Vout = \frac{Vin(1 + (p^2/p0^2))}{1 + m^*(p/p0) + (p/p0)[(1 + L) - (L^*k)]} \quad G1.2.1A$$

In this band elimination filter configuration, the ratio of gm1/gm2 of the general equation G 1.2.1 is set to unity (e.g., gm1=gm2); Vb=0 and V1=Vh=Vin.

Figure 3B:
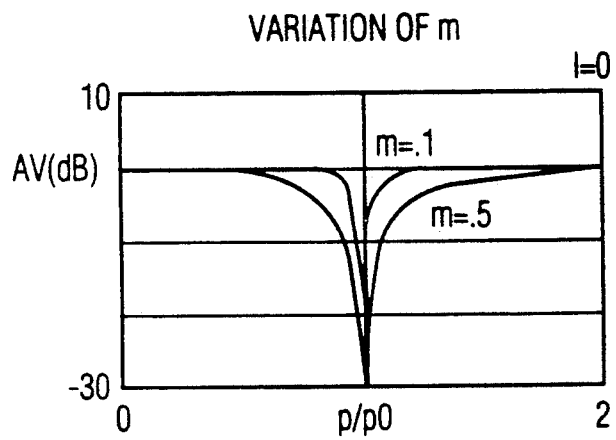
FIG. 3b is a diagram illustrating frequency response characteristics of the filter of FIG. 3a as a function of variations of the variable m.
Figure 3C:
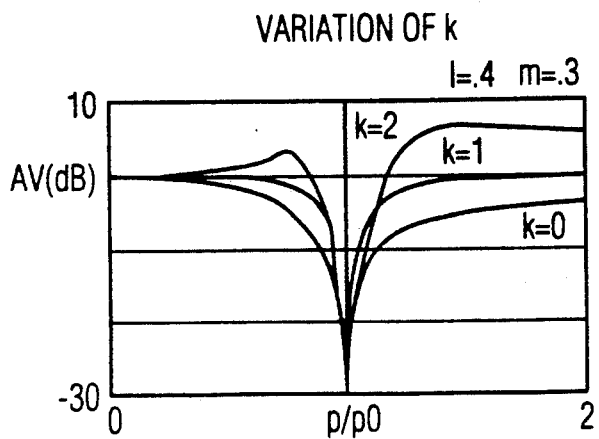
FIG. 3c is a diagram illustrating frequency response characteristics of the filter of FIG. 3a as a function of variations of the variable k.

FIGS. 3b and 3c show the amplitude (Av) versus frequency responses of the trap filter for one case with L=zero and for the variation of m and for another case with L=four, m=three and a variation of k. The transfer function Vout/Vin or "Av" of the filter of FIG. 3a is obtained by dividing expression G1.2.1A by Vin. As shown in FIG. 3b, the higher the value of the variable "m", the steeper the path of the level decrease with the center frequency of the trap filter. With the variation of the variable "k", as in FIG. 3c, the frequency response of the trap filter shows that the larger the value of the variable "k", the sharper the band-edge becomes and the steeper the level decrease becomes. In other words, the variable "k", in this application, influences the transition band slope and the band edge response shape with "peaking" or boosting of the response corners for higher values of k and with rounding of the corners at lower values of the variable "k".

Figure 4A:
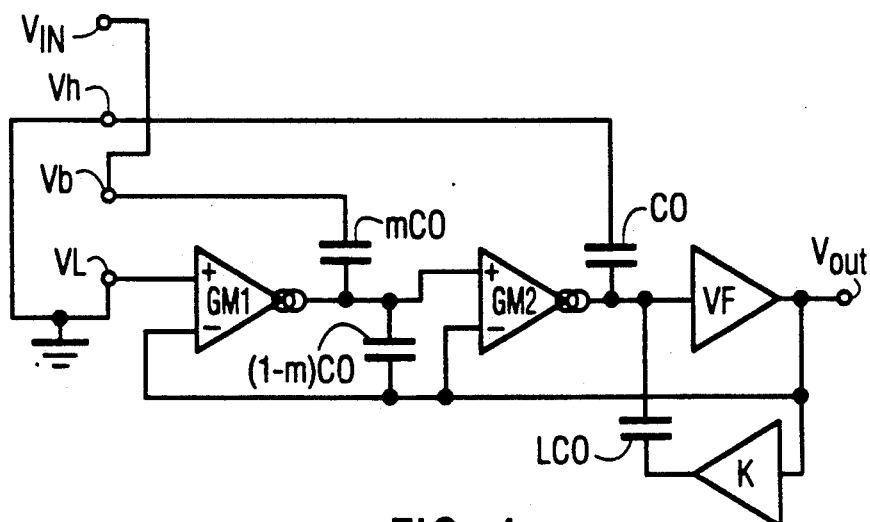
FIG. 4a is a block diagram illustrating the universal filter according to FIG. 2 wired as band pass filter.

In FIG. 4a the universal filter according to FIG. 2 is wired as band pass filter. Here, the inputs Vh and VL are connected to each other and are clamped to a point of reference potential shown here as ground. The parameter L is set to zero and the input signal to be filtered (Vin) is applied to the input terminal Vb. Under these conditions the following results for the output voltage, Vout:

$$Vout = \frac{m^*(P/PO)Vin}{1 + m^*(p/p0) + (p^2/p0^2)^*(gm1/gm2)} \quad \text{G1.2.1.B}$$

Figure 4B:
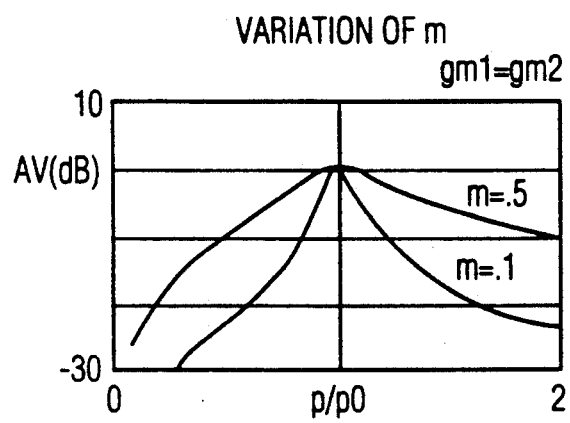
Figure 4C:
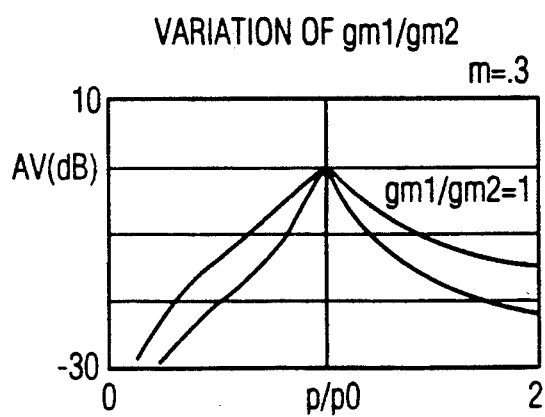

In FIG. 4b the frequency responses of the band pass filter is shown for the case of a variation of m and in FIG. 4c the frequency response is shown for a variation of gm1/gm2. The transfer function Av is obtained by dividing equation G1.2.1B by Vin. FIG. 4b shows the effect of setting the transconductances equal (gm1=gm2) and varying the value of the parameter m. As shown, The higher m, the flatter the path of the frequency response in the range of the center frequency. The diagram of FIG. 4c illustrates the effect on the frequency response for the case where m=3 and the transconductance ratio (gm1/gm2) is varied between values of 1 and 5. As is seen, the higher the ratio of gm1/gm2 the steeper the drop of the frequency response at the edges.

Figure 5:
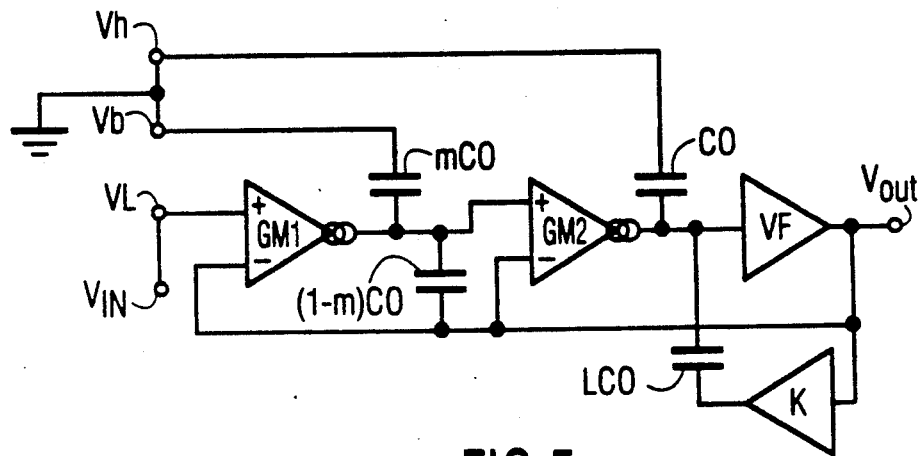
FIG. 5 is a block diagram of a universal filter according to FIG. 2 wired as low pass filter.

In FIG. 5 the universal filter according to FIG. 2 is wired as low pass filter. The inputs Vh and Vb are connected to each other and clamped to ground. The input signal to be filtered Vin is applied to the input terminal VL. The parameter L is set to zero. Under these conditions, the general transfer function of expression G1.2.1 reduces to the following form providing low pass filtering action:

$$Vout = \frac{Vin}{1 + m^*(p/p0) + (p^2/p0^2)^*(gm1/gm2)} \quad \text{G1.2.1.C}$$

Figure 6:
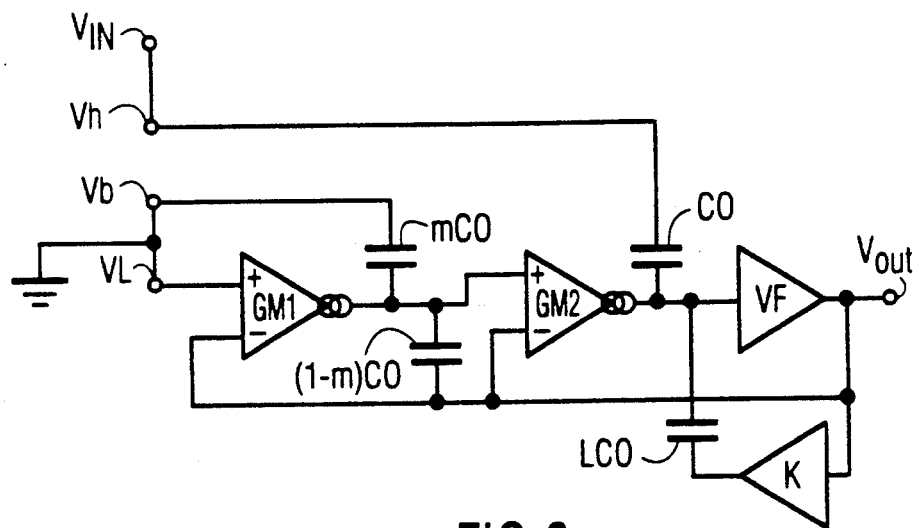
FIG. 6 is a block diagram of a universal filter according to FIG. 2 wired as high pass filter.

In FIG. 6 the universal filter according to FIG. 2 is wired as high pass filter. To achieve a high pass characteristic, the input VL is connected with the input Vb and clamped to ground. The parameter L is set to zero and the input signal Vin is applied to the input Vh. These changes result in high pass filter action in accordance with the following expression:

$$Vout = \frac{(p^2/p0^2)^*(gm1/gm2)^*Vin}{1 + m^*(p/p0) + (p^2/p0^2)^*(gm1/gm2)} \quad \text{1.2.1.D}$$

Figure 7:
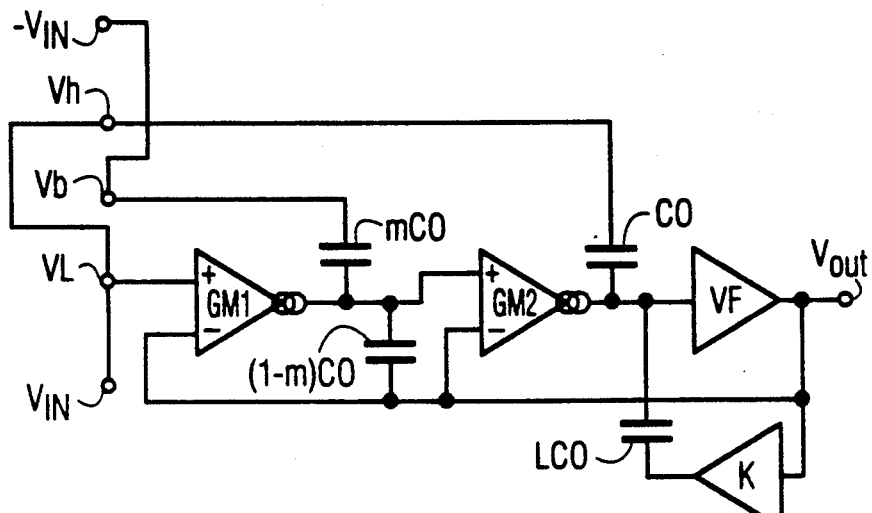
FIG. 7 is a block diagram of a universal filter according to FIG. 2 wired as all pass filter.

In FIG. 7 the universal filter according to FIG. 2 is wired as an all-pass filter. Again, the variable L is set to 0. The two inputs Vh and VL are connected to each other. For the inputs, the input signal is applied to inputs Vh and VL and is inverted for application to input Vb. Alternatively, the input signal may be applied to Vb and inverted for application to inputs Vh and VL. The result is the same except for a phase reversal. No inverter is needed, of course, if the source of input signal Vin provides differential output signals. The response of the all-pass filter, for these conditions, is as follows:

$$Vout = \frac{VL - m^*(p/p0)^*Vb + (p^2/p0^2)^*(gm1/gm2)^*Vh}{1 + m^*(p/p0) + (p^2/p0^2)^*(gm1/gm2)^*} \quad \text{G1.2.1.E}$$

For all formulas the following applies: p0=gm1/CO. The difference between an operational amplifier and a (operational) trans-conductance amplifier (OTA) lies in the fact that an operational amplifier amplifies the voltage difference (difference voltage) at the input up to 100000 times and makes available this amplified voltage at its output while the OTA, while also amplifying the difference voltage at the input, provides, however, for an adjustable "amplification factor" (transconductance, gm), and at the output there appears a current instead of a voltage. The amplification factor of the OTA is expressed in mA/V and is called transconductance (gm) or "steepness". In terms of integrated semiconductor components, some examples of such amplifiers are the types LM 13600 and LM 13800 by RCA.

With all circuits in the FIGS. 2 through 7 the respective center frequency or limit frequency of the filters can be altered through the ratio of p/PO. The quality (i.e., "Q") of the band pass is continuously adjustable by selection of the ratio 1:m.

Circuits according to the above named type can be utilized in particular with television receivers, with multi-standard television receivers, radio receivers and trade show exemplar devices to name but a small number of applications. With multi-standard television receivers they can be used in a suitable manner because in one case there is a wanted signal at a particular frequency at which there appears an interference signal in another standard. Thus, by means of the invention it is possible to differently suppress or pass a signal as needed. Hereby, such circuits can be usefully utilized for flexible analog signal processing.

Through their efficient and compact circuit topography, the filters of the present invention provide many advantages as previously noted. It will be noted in this regard that if fabricated in a integrated circuit form, the expenditure on circuitry—the so-called overhead—is kept small thus requiring little "chip" area and the total integration process is facilitated.

There has been shown and described, in accordance with the invention, a universal filter that is provided with three inputs Vh, Vb and VL, with one output Vout, with two transconductance amplifiers gm1, gm2, with four capacitors mCO, (1−m)CO, CO and LCO and an amplifier K with an amplification k as well as a voltage follower VF with a high Ohmic input. Depending on the connections of the inputs VL, Vb and Vh, the universal filter takes the form of a high-pass or low-pass or band-pass filter or a trap filter or an all-pass or an otherwise active filter. Depending on the magnitude of the parameters gm1, gm2, m, L and k, the various filter characteristics like quality (Q), slope, median frequency, amplification, etc., may be adjusted. The low component count of the filter provides improved reliability, reduced cost and facilitates efficient fabrication in discrete or integrated circuit form.

What is claimed is:

1. A universal active filter, comprising:
   first, second and third inputs (V1, Vb, Vh) and an output (Vout);
   said first input (V1) being connected with the non-inverting input of a first trans-conductance amplifier (GM1) having an amplification gm1;
   said second input (Vb) being connected, via a first capacitor (mCO), with the output of said first trans-conductance amplifier (GM1), with the non-inverting input of a second trans-conductance amplifier (GM2) having an amplification gm2, as well as with a second capacitor ((1−m)CO);
   said third input (Vh) being connected, via a third capacitor (CO), with the output of said second trans-conductance amplifier (GM2), with the input of a voltage follower (VF) having a high-resistance input, and with a feedback capacitor (LCO); and said filter output (Vout) being connected to the output of said voltage follower (VF), to the inverting inputs of the two transconductance amplifiers (GM1 and GM2), to the second capacitor ((1−m)CO), as well as to the input of an amplifier (K) having an amplification k and having an output connected to said feedback capacitor (LCO).

2. A universal filter according to claim 1, wherein said filter exhibits an output response Vout of the general form:

$$Vout = \frac{V1 + m*(p/p0)*Vb + (p2/p0^2)*(gm1/gm2)*Vh}{1 + m*(p/p0) + (p2/p0^2)*(gm1/gm2)*[(1 + L) - (L*k)]}$$

and wherein the transconductance (gm1) of the first amplifier and the capacitance (CO) of said third capacitor are selected such that:

$$p0 = gm1/CO$$

3. A universal filter according to claim 1, characterized in that the universal filter is constructed as an integrated circuit.

4. A universal filter according to claim 1 wherein, for operation of said filter in a band elimination mode, said filter further comprises:
   means for applying an input signal to be filtered to said first and third inputs; and
   means for coupling said second input to a point of reference potential.

5. A universal filter according to claim 1 wherein, for operation as a band pass filter, said filter further comprises:
   means for applying an input signal to be filtered to said second input; and
   means for coupling said first and third inputs together and to a point of reference potential.

6. A universal filter according to claim 1 wherein, for operation as a low-pass filter, said filter further comprises:
   means for applying an input signal to be filtered to said first input; and
   means for coupling said second and third inputs together and to a source of reference potential.

7. A universal filter according to claim 1 wherein, for operation as a high-pass filter, said filter further comprises:
   means for applying an input signal to be filtered to said third input; and
   means for coupling said first and second inputs together and to a source of reference potential.

8. A universal filter according to claim 1 wherein, for operation as an all-pass filter, said filter further comprises:
   means for applying a first input signal to said first and third inputs; and
   means for applying a second input signal to said second input, one of said input signals being inverted relative to the other input signal.

9. A method of filtering, comprising:
   providing first, second and third inputs (V1, Vb, Vh) and an output (Vout);
   coupling said first input (V1) to the non-inverting input of a first trans-conductance amplifier (GM1) having an amplification gm1;
   coupling said second input (Vb), via a first capacitor (mCO), to the output of said first trans-conductance amplifier (GM1), to the non-inverting input of a second trans-conductance amplifier (GM2) having an amplification gm2, and to a second capacitor ((1−m)CO);
   coupling said third input (Vh), via a third capacitor (CO), to the output of said second trans-conductance amplifier (GM2), to the input of a voltage follower (VF), and to a feedback capacitor (LCO); and
   coupling said filter output (Vout) to the output of said voltage follower (VF), to the inverting inputs of the two trans-conductance amplifiers (GM1 and GM2), to the second capacitor ((1−m)CO), to the input of an amplifier (K) having an amplification k and having an output connected to said feedback capacitor (LCO).

10. A method according to claim 9, wherein said filtering exhibits a response Vout of the general form:

$$Vout = \frac{V1 + m*(p/p0)*Vb + (p2/p0^2)*(gm1/gm2)*Vh}{1 + m*(p/p0) + (p2/p0^2)*(gm1/gm2)*[(1 + L) - (L*k)]}$$

and further comprising the step of selecting the transconductance (gm1) of the first amplifier and the capacitance (CO) of said third capacitor with respect to the filter design frequency p0 such that p0 = gm1/CO.

11. A method according to claim 9, further comprising the step of constructing said filter as an integrated circuit.

12. A method according to claim 9 wherein, for band elimination filtering, said method further comprises the steps of:
   applying an input signal to be filtered to said first and third inputs; and
   coupling said second input to a point of reference potential.

13. A method according to claim 9 wherein, for band pass filtering, said filtering further comprises:
   applying an input signal to be filtered to said second input; and
   coupling said first and third inputs together and to a point of reference potential.

14. A method according to claim 9 wherein, for low pass filtering, said method further comprises:
   applying an input signal to be filtered to said first input; and
   coupling said second and third inputs together and to a source of reference potential.

15. A method according to claim 9 wherein, for high pass filtering, said method further comprises:
   applying an input signal to be filtered to said third input; and
   coupling said first and second inputs together and to a source of reference potential.

16. A method according to claim 9 wherein, for all-pass filtering, said method further comprises:
   applying a first input signal to said first and third inputs; and
   applying a second input signal to said second input, one of said input signals being inverted relative to the other input signal.

* * * * *